United States Patent
Choy et al.

(10) Patent No.: US 9,224,486 B1
(45) Date of Patent: Dec. 29, 2015

(54) CONTROL GATE DRIVER FOR USE WITH SPLIT GATE MEMORY CELLS

(71) Applicants: Jon S. Choy, Austin, TX (US); Anirban Roy, Austin, TX (US)

(72) Inventors: Jon S. Choy, Austin, TX (US); Anirban Roy, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/310,585

(22) Filed: Jun. 20, 2014

(51) Int. Cl.
G11C 16/04 (2006.01)
G11C 16/24 (2006.01)
G11C 16/26 (2006.01)
G11C 16/22 (2006.01)
G11C 16/12 (2006.01)
G11C 16/34 (2006.01)

(52) U.S. Cl.
CPC ............. G11C 16/24 (2013.01); G11C 16/12 (2013.01); G11C 16/225 (2013.01); G11C 16/26 (2013.01); G11C 16/3445 (2013.01); G11C 16/3459 (2013.01)

(58) Field of Classification Search
CPC ........... G11C 16/0416; G11C 16/0483; G11C 2211/5612; G11C 11/5642; G11C 11/5628; G11C 16/0425; G11C 16/14; H01L 29/42324; H01L 29/66825; H01L 29/66833
USPC ............. 365/185.18, 185.29, 185.23, 185.25, 365/185.08, 185.21, 196, 230.03, 185.14, 365/185.26, 185.33
See application file for complete search history.

(56) References Cited

U.S. PATENT DOCUMENTS

| 5,828,607 | A | 10/1998 | Bushey et al. |
| 6,356,481 | B1 | 3/2002 | Micheloni et al. |
| 6,621,745 | B1 | 9/2003 | Manea |
| 8,737,137 | B1 | 5/2014 | Choy et al. |
| 2005/0270851 | A1* | 12/2005 | Kato et al. ............... 365/185.29 |

* cited by examiner

Primary Examiner — Thong Q Le

(57) ABSTRACT

A circuit for driving a control gate of a split-gate nonvolatile memory cell may include a switched current source; a first transistor having a current electrode coupled to the switched current source and a control electrode coupled to a voltage source; a second transistor having a current electrode coupled to a second node of the switched current source, and a control electrode coupled to a third voltage source; a third transistor having a control electrode coupled to the second transistor, a current electrode coupled to the first transistor and a fourth switched voltage source; and a fourth transistor having a current electrode coupled to the first switched voltage source, a control electrode coupled to the switched current source, and a second current electrode coupled to the second transistor at a driver voltage node, wherein a voltage level at the driver voltage node is operable to drive the control gate.

19 Claims, 6 Drawing Sheets

CONTROL GATE DRIVER FOR USE WITH SPLIT GATE MEMORY CELLS

BACKGROUND

1. Field

This disclosure relates generally to integrated circuits, and more specifically, to a control gate driver for use with a split gate bit cell.

2. Related Art

Within a split gate memory cell array, each row of memory cells may be coupled to a control gate driver which drives a required voltage level onto the control gates of the split gate memory cells in accordance with the desired operation. For example, the voltage applied to the control gate of a memory cell depends on whether the desired operation of that memory cell is a program select operation, a program deselect operation, an erase operation, an erase verify operation, a program verify operation, etc. For some operations, a high voltage is required for the control gate of the memory cell. However, within the control gate driver, this high voltage may result in damaging one or more transistors of the control gate driver. In one solution today, each device is placed into its own isolated well. However, this results in increasingly large layouts which require greater circuit area. This results in increased size and cost and is thus undesirable. Therefore, a need exists for an improved control gate driver capable of handling high voltages.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In order to minimize the number of individual isolated wells, one embodiment provides for a control gate driver circuit which is coupled to various voltage supply switches which control voltage levels applied to the control gate driver circuit so that no devices in the control gate driver circuit sees a stress level across junctions or oxides which results in damaging the device. In this manner, the control gate driver circuit is able to provide the full range of voltages, including high voltage levels, in order to implement the various memory operations.

Figure 1:
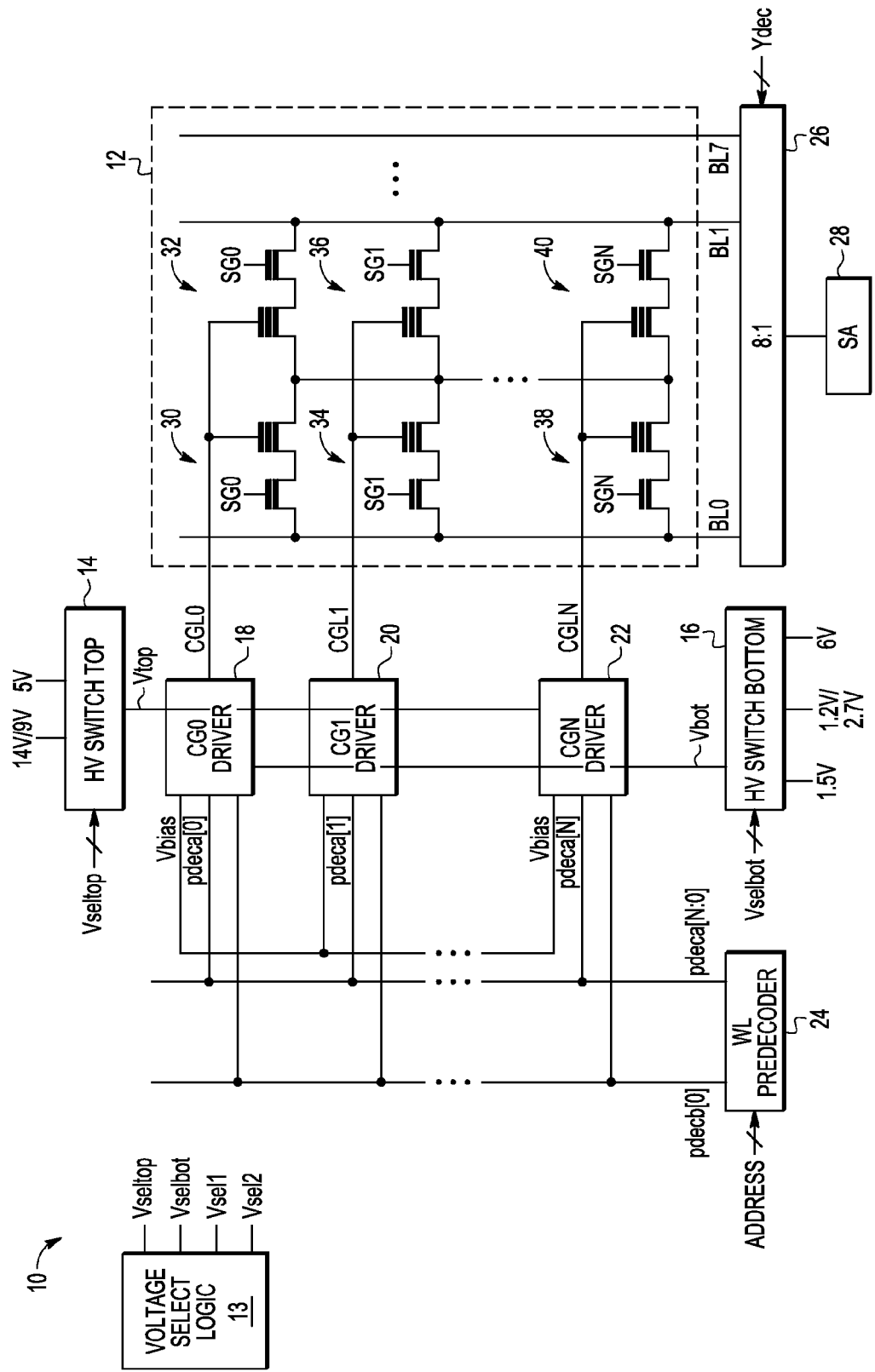
FIG. 1 illustrates, in partial block diagram and partial schematic form, a split gate memory in accordance with one embodiment of the present invention.

FIG. 1 illustrates, in partial schematic and partial block diagram form, a split gate memory 10 in accordance with one embodiment of the present invention. Memory 10 includes voltage select logic 13, a high voltage (HV) switch top circuit 14, a HV switch bottom circuit 16, a word line (WL) decoder 24, N+1 control gate drivers 18, 20, and 22, a memory array 12 including N+1 control gate lines CGL0-CGLN (corresponding to rows) and 8 bit lines BL0-BL7 (corresponding to columns), an 8:1 decoder 26, and a sense amplifier (SA) 28. Array 12 also includes N+1 word lines, in which each word line corresponds to a row of select gates, SG0-SGN. For example, word line 0 corresponds to SG0, word line 1 to SG1, and word line N to SGN. A split gate memory cell having a select gate (SG) and a control gate (CG) is located at the intersection of each word line and bit line of array 12. Memory cell 30 is coupled to CGL0, SG0, and BL0, memory cell 32 is coupled to CGL0, SG0, and BL1, memory cell 34 is coupled to CGL1, SG1, and BL0, memory cell 36 is coupled to CGL1, SG1, and BL1, memory cell 38 is coupled to CGLN, SGN, and BL0, and memory cell 40 is coupled to CGLN, SGN, and BL1. In each memory cell, a drain is coupled to the corresponding bit line, a control gate is coupled to the corresponding CGL to receive a control gate voltage (Vcg), and a select gate is coupled to a corresponding word line to receive a select gate voltage (Vsg). The sources of the memory cells are coupled together to a common node and may, for example, be grounded.

Note that FIG. 1 illustrates only a portion of a split gate memory in which memory 10 may include any number of rows (and thus word lines) and any number of columns (and thus bit lines). Groupings of bit lines are each provided to a corresponding decoder, such as 8:1 decoder 26, in which each decoder is coupled to a corresponding sense amplifier.

WL predecoder 24 receives an access address to memory 10 and uses the address to generate predecode "a" bits (pdeca) and predecode "b" bits (pdecb). Each control gate driver is coupled to receive a pair of predecode bits from WL predecoder 24 and a voltage, Vpbias. Each control gate driver CG0-CGN receives a predecode "b" bit, pdecb[0], and a corresponding predecode "a" bit, one of pdeca[0-N]. Based on the received access address, the appropriate predecode bits are provided to the control gate drivers which results in selecting a particular control gate driver (and thus a particular CGL). The selected control gate driver drives the corresponding selected CG line (one CG line of CGL0-CGLN) by providing an appropriate voltage (Vcg) to the CG line which is supplied to the control gates of the memory cells coupled to the selected CG line. The remaining CG lines (i.e. the deselected CG lines) are driven to a different voltage which is provided to the control gates of the memory cells coupled to the deselected CG lines. Details of the control gate drivers will be provided with respect to FIGS. 2-6 below.

Also based on the access address, a y decode signal, ydec, is generated which couples the selected bit line (one bit line of BL0-BL7) to SA 28 in order to perform a read. Therefore, based on the value stored in the memory cell coupled at the intersection of the selected word line and selected bit line, a current is supplied by the selected memory cell to SA 28 which determines the stored value of the selected memory cell.

Voltage select logic 13 provides voltage select signals Vseltop, Vselbot, Vsel1, and Vsel2. Each of these voltage select signals is provided to an appropriate voltage switch to select an appropriate voltage supply. For example, HV switch top 14 (also referred to as a switched voltage source) receives Vseltop which selected between the first input to HV switch top (which can be set to either 14V, corresponding to an erase control gate voltage, or 9V, corresponding to a program control gate voltage) and the second input to HV switch top (which can be 5V, corresponding to a read control gate pass voltage). The selected voltage is provided as Vtop to the control gate drivers. Similarly, Vselbot is provided to HV switch bottom 16 (also referred to as a switched voltage source) to select the appropriate voltage input to be provided as Vbot to the control gate drivers. Vbot may be, for example 1.2V (corresponding to an erase verification voltage), 1.5V (corresponding to a read control gate pass voltage), 5V (corresponding to a read control gate voltage), or 2.7V (corresponding to a program verification voltage). As will be seen below, Vsel1 and Vsel2 are provided to voltage switches located within the control gate drivers.

Figure 2:
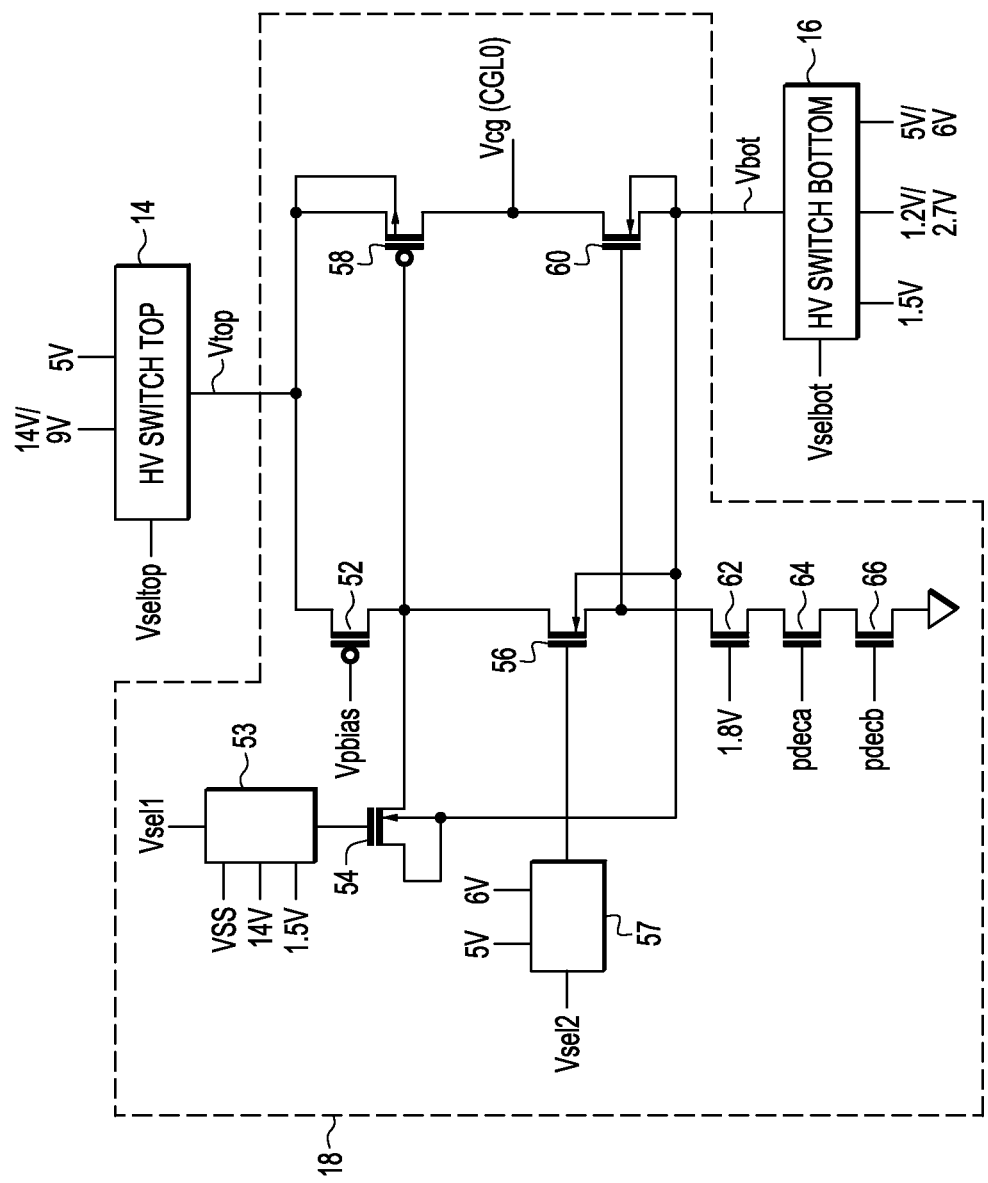
FIG. 2 illustrates, in partial block diagram and partial schematic form, a more detailed control gate driver circuit of FIG. 1, in accordance with one embodiment of the present invention.

FIG. 2 illustrates control gate driver 18 (CG0) in further detail in which operation of control gate driver 18 will be described in reference to various different memory operations illustrated in FIGS. 3-6. Note that the description of control gate driver 18 is analogous to the operation of the other control gate drivers of memory 10.

Referring to FIG. 2, control gate driver 18 includes a voltage switch 53 (also referred to as a switched voltage source), a voltage switch 57 (also referred to as a switched voltage source), p channel transistors (i.e. p type transistors) 52 and 58, and n channel transistors (i.e. n type transistors) 54, 56, 60, 62, 64, and 66. A first current electrode of transistor 52 is coupled to receive Vtop, a control electrode of transistor 52 is coupled to receive Vpbias. A first current electrode and a well of transistor 58 is coupled to receive Vtop. A control electrode of transistor 54 is coupled to receive a voltage from voltage switch 53. A first current electrode of transistor 54 is coupled to a well of transistor 54. A second current electrode of transistor 54 is coupled to a second current electrode of transistor 52 and to a control electrode of transistor 58. A second current electrode of transistor 52 is coupled to a first current electrode of transistor 56. A control electrode of transistor 56 is coupled to receive a voltage from voltage switch 57. A well of transistor 56 is coupled to the first current electrode of transistor 54. A second current electrode of transistor 58 is coupled to a first current electrode of transistor 60. A control electrode of transistor 60 is coupled to a second current electrode of transistor 56, and a well and a second current electrode of transistor 60 are coupled to the first current electrode of transistor 54, the well of transistor 56, and coupled to receive Vbot from HV switch bottom 16. A second current electrode of transistor 56 is coupled to a first current electrode of transistor 62. A control electrode of transistor 62 is coupled to receive a low voltage (LV) protection voltage, for example, 1.8V, and a second current electrode of transistor 62 is coupled to a first current electrode of transistor 64. Transistor 62 may allow transistors 66 and 64 to be LV devices. A control electrode of transistor 64 is coupled to receive pdeca[0], and a second current electrode of transistor 64 is coupled to a first current electrode of transistor 66. A control electrode of transistor 66 is coupled to receive pdecb[0], and a second current electrode of transistor 66 is coupled to ground. The second current electrode of transistor 58 and the first current electrode of transistor 60 are coupled to provide the CG line output voltage for CGL0 and thus supplies the appropriate control gate voltage, Vcg, to the control gates of the memory cells coupled to CGL0.

Voltage switch 53 receives Vsel1 and, in response to Vsel1, provides the selected voltage of Vss (corresponding to a source voltage), 14V (corresponding to an erase control gate voltage), or 1.5V (corresponding to a read control gate voltage) to a control gate of transistor 54. Voltage switch 57 receives Vsel2 and, in response to Vsel2, provides the selected voltage of 5V (corresponding to a read control gate pass voltage) or 6V (corresponding to an erase protection voltage) to a control gate of transistor 56. As was described in reference to FIG. 1, HV switch top 14 receives Vseltop and, in response thereto, provides the select voltage of 14V/9V or 5V as Vtop to first current electrodes of transistors 52 and 58. HV switch bottom 16 receives Vselbot and, in response thereto, provides the select voltage of 1.5V or 1.2V/2.7V or 5V/6V as Vbot to a second current electrode of transistor 60.

Note that transistor 52 operates as a current source which may be set appropriately by the value of Vpbias. Therefore, transistor 52 may also be referred to as a switched current source. Also, the voltage values provided as inputs to each of the voltage switches (such as voltage switches 14, 16, 53, and 57) in each of FIGS. 2-6 are merely examples and other voltage values may be used depending on the needs and design of memory 10, and on the memory operation being performed.

Control electrodes of transistors 64 and 66 receive predecode bits pdeca and pdecb, respectively. Therefore, when selected by assertion of pdeca and pdecb, transistors 64 and 66 are on and the second current electrode of transistor 56 is pulled to ground. However, if either pdeca or pdecb (or both) are negated, the second current electrode of transistor 56 is not pulled to ground, as will be described further below. Note that transistors 64 and 66 may be referred to as an address decoder circuit. The second current electrode of transistor 58 and the first current electrode of transistor 60 are coupled at a driver voltage node which provides a control gate voltage, Vcg, to drive the control gates of those memory cells coupled to CGL0.

Figure 3:
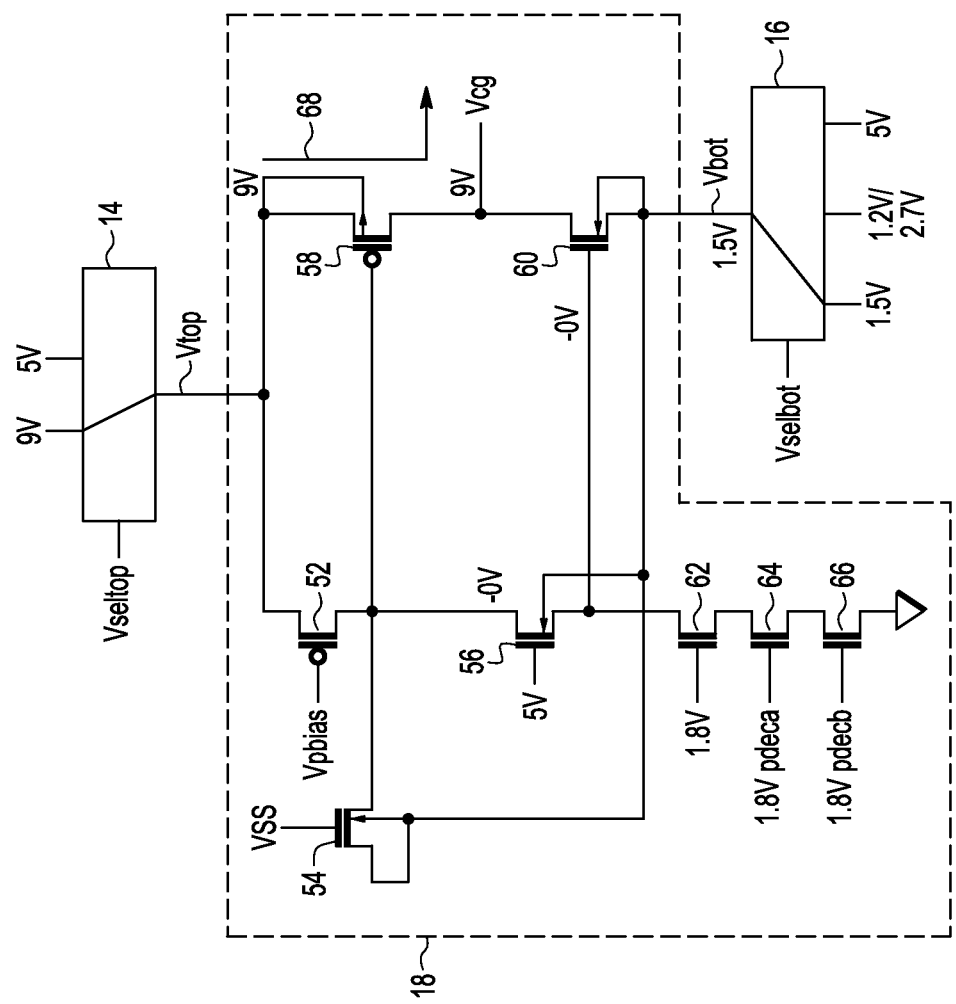
FIGS. 3-6 illustrate, in partial block diagram and partial schematic form, the control gate driver circuit of FIG. 2 during various example operations, including a program select operation, a program deselect operation, an erase operation, and a read operation.

FIG. 3 illustrates a configuration for control gate driver 18 during a program select operation. For a program select operation for control gate driver 18, CGL0 corresponds to a selected CG line in which a memory cell coupled to CGL0 is to be programmed. In order to program a selected memory cell, CGL0 is driven to 9V such that a control gate voltage (Vcg) of 9V is applied to the control gate of the selected memory cell. Appropriate voltages for other nodes of the memory cell (such as Vsg for SG0) can be provided accordingly by other circuitry, as known in the art. For the program selection operation, Vseltop is set so as to select 9V (also referred to as a program control gate voltage) to be supplied as Vtop, and Vselbot is set so as to select 1.5V (also referred to as a read control gate voltage) to be supplied as Vbot. Also, Vsel1 is set so as to select 0V (also referred to as read control gate pass voltage) and Vsel2 is set so as to select 5V (also referred to as a read control gate voltage).

CGL0 is selected when pdeca and pdecb are both asserted. In this manner, 1.8V is applied to the control gates of transistors 64 and 66 such that transistors 62, 64, and 66 are all turned on. (Note that transistor 62 provides protection to transistors 64 and 66.) Therefore, the second current electrode of transistor 56 is pulled to Vss. With 0V on the control electrode of transistor 60, transistor 60 is turned off. Also, the voltage at the first current electrode of transistor 56 is about 0V which turns on transistor 58. In this manner, the 9V of Vtop at the first current electrode of transistor 58 is provided as Vcg at the second current electrode of transistor 58. Note that direction of current flow is represented by arrow 68.

Figure 4:
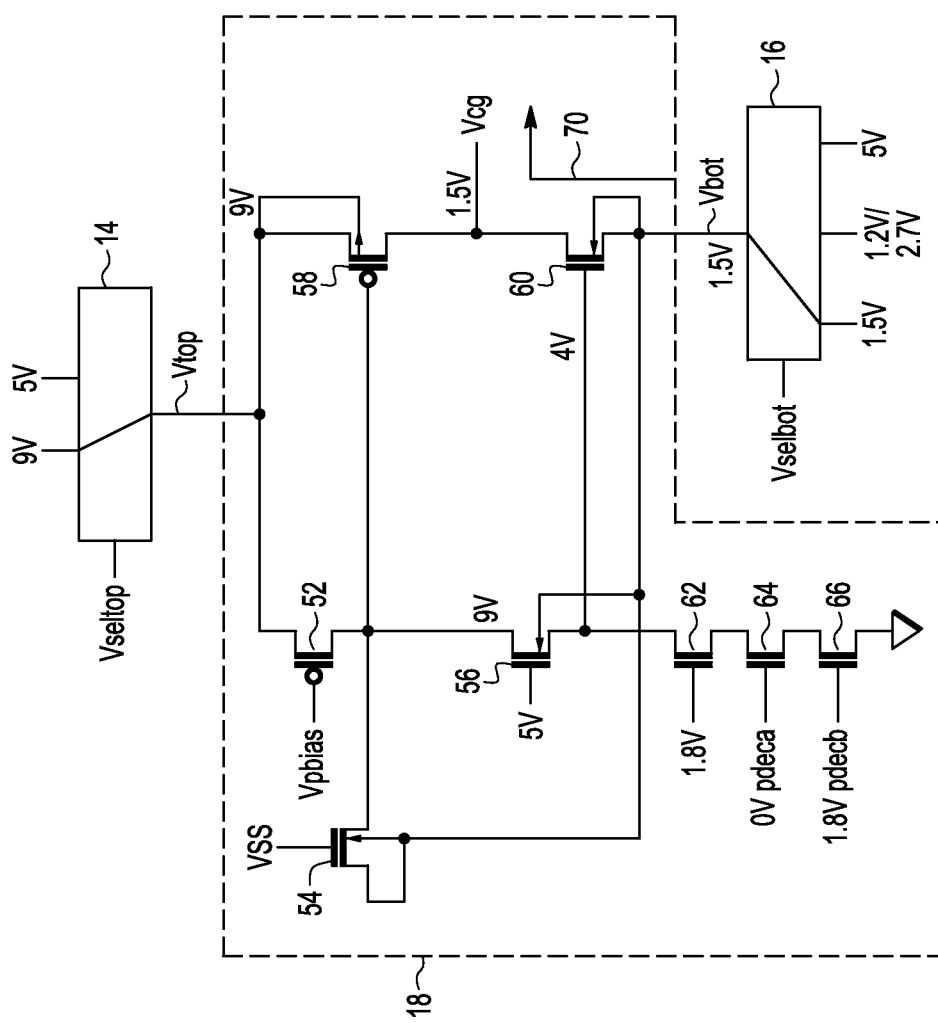

FIG. 4 illustrates a configuration for control gate driver 18 during a program deselect operation. For a program deselect operation for control gate driver 18, CGL0 corresponds to a deselected CG line in which any memory cell coupled to CGL0 is not selected for programming. For a deselected CGline, CGL0 is driven to 1.5V such that a control gate voltage (Vcg) of 1.5V is applied to the control gate of the deselected memory cells. Appropriate voltages for other nodes of the memory cell (such as Vsg for SG0) can be provided accordingly by other circuitry, as known in the art. For the program deselect operation, Vseltop is set so as to select 9V (also referred to as a program control gate voltage) to be supplied as Vtop, and Vselbot is set so as to select 1.5V (also referred to as a read control gate voltage) to be supplied as Vbot. Also, Vsel1 is set so as to select 0V and Vsel2 is set so as to select 5V (also referred to as a read control gate pass voltage).

CGL0 is not selected when either pdeca or pdecb is not asserted or when both are not asserted. In the current example, pdeca is not asserted and pdecb is asserted. However, since pdeca is not asserted, transistor 64 is off which cuts off the path between transistor 56 to Vss. In this case, the first current electrode of transistor 56 is at about 9V and the second current electrode of transistor 56 is pulled up to about 4V, which is a voltage high enough to turn on transistor 60. Also, with 9V at the control gate of transistor 58, transistor 58 is off. Therefore, Vcg is pulled low to Vbot and thus outputs a deselected voltage of 1.5V. That is, CGL0, since it is deselected, is driven only to 1.5V in which case the memory cells coupled to CGL0 will not be programmed. Note that direction of current flow is represented by arrow 70.

Figure 5:
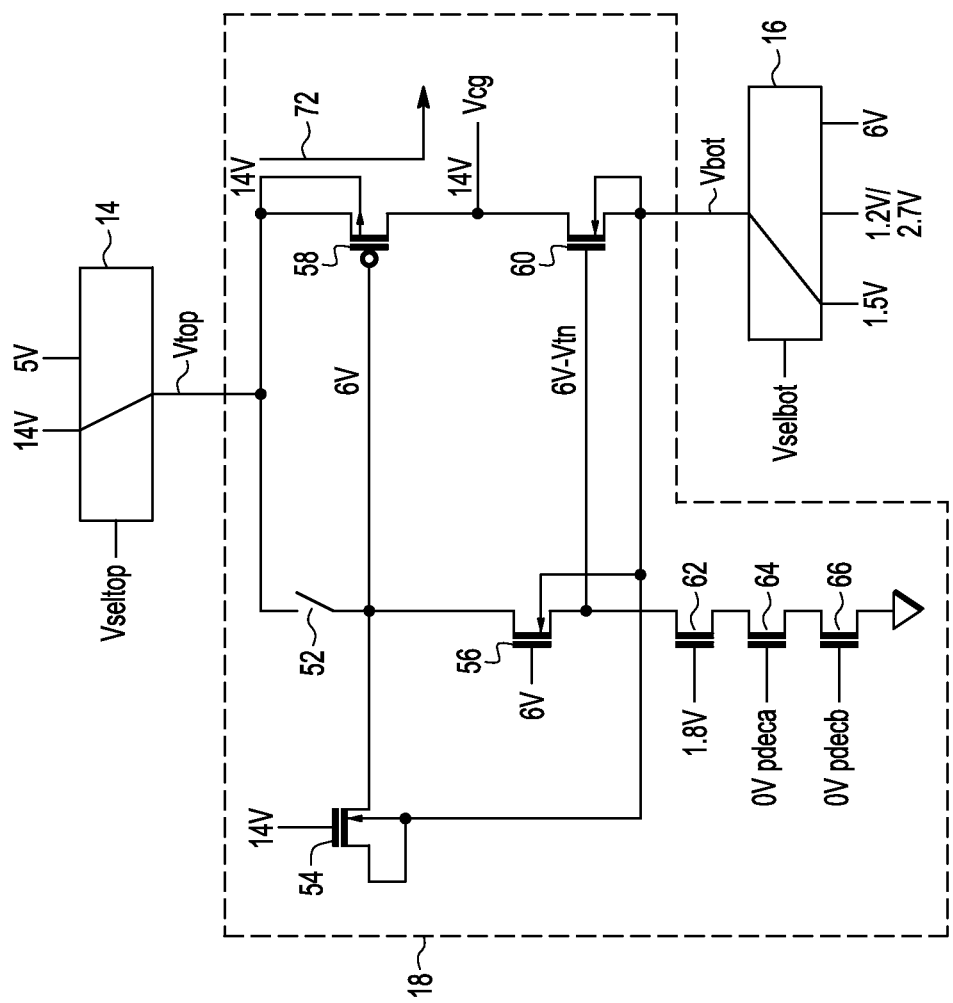

FIG. 5 illustrates a configuration for control gate driver 18 during an erase operation. For an erase selection operation, pdeca and pdecb are not asserted because an erase is performed on an entire group of array 12. Therefore, all memory cells in the group are erased. Control gate driver 18 provides the control gate voltage necessary to perform the erase operation to the memory cells coupled to CGL0. Appropriate voltages for other nodes of the memory cell (such as Vsg for SG0) can be provided accordingly by other circuitry, as known in the art. For the erase operation, Vseltop is set so as to select 14V (also referred to as an erase control gate voltage) to be supplied as Vtop, and Vselbot is set so as to select 6V (also referred to as an erase protection voltage) to be supplied as Vbot. With pdeca and pdecb deasserted, transistors 64 and 66 are off. Also, Vsel1 is set so as to select 14V (also referred to as an erase control gate voltage) to be provided to the control electrode of transistor 54, and Vpbias is set to 14V as well. Vsel2 is set so as to select 6V (also referred to as an erase protection voltage) to be provided to the control electrode of transistor 56.

With the control gate of transistor 54 at 14V, the voltage of Vbot is applied to the control gate of transistor 58. This turns on transistor 58. In this manner, the 14V of Vtop is provided as Vcg (and note that since the control gate of transistor 60 is at a Vt drop below 6V, transistor 60 is off). Note that direction of current flow is represented by arrow 70. For an erase operation, CGL0 needs to be driven to a high voltage, such as the 14V. However, if the control gate of transistor 58 is at a low enough voltage that the difference between the 14V of Vtop and the voltage at the control gate is larger than a breakdown voltage of transistor 58, control gate driver 18 would be damaged. In order to prevent damage of control gate driver during the high voltage required by the erase operation, transistor 54 ensures that the control electrode of transistor 58 is sufficiently pulled up to allow transistor 58 to still turn on but to maintain the voltage drop between the first current electrode and control electrode of transistor 58 to remain within safe ranges.

Figure 6:
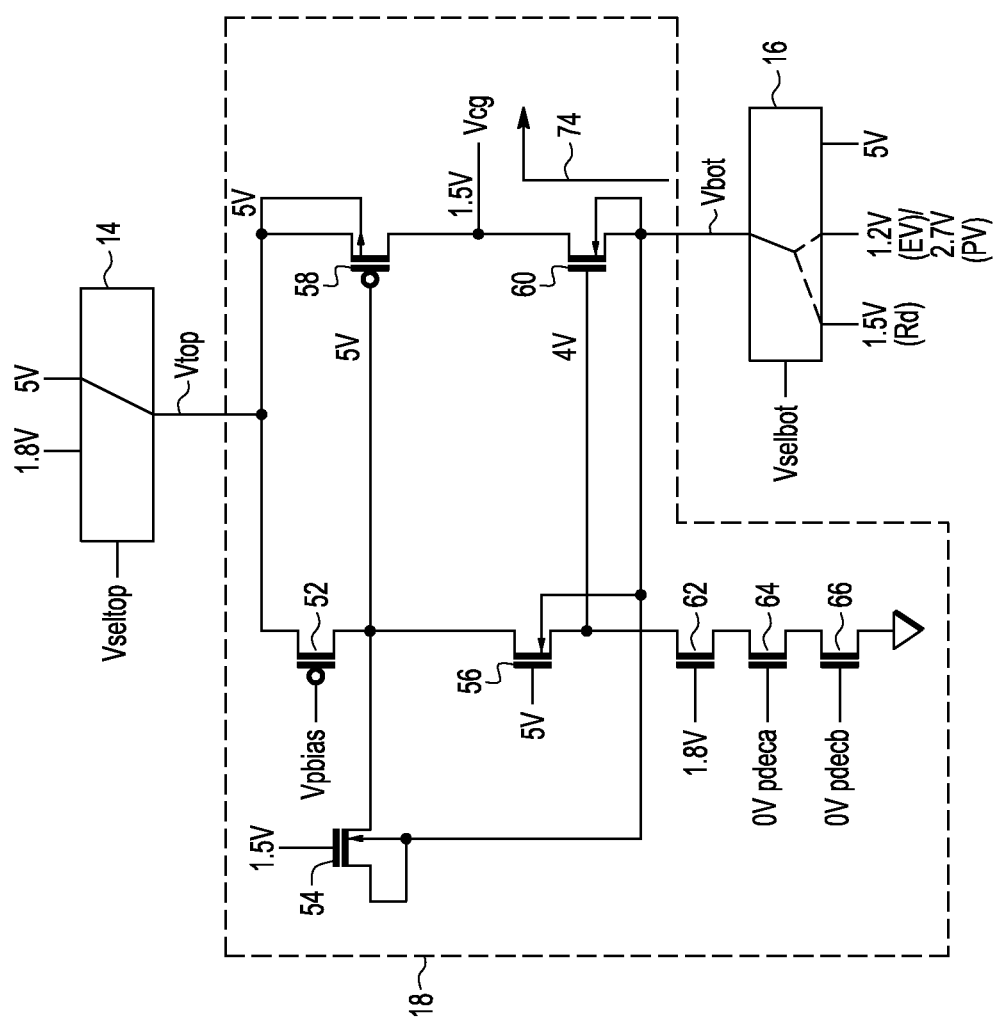

FIG. 6 illustrates a configuration for control gate driver 18 during an operation which includes a read function. In one embodiment, there are three types of operations which include a read function: a read operation for sensing the stored value in a memory cell, en erase verify operation to ensure that a memory cell was properly erased, and a program verify operation to ensure that a memory cell was properly programmed. For a read operation, all the control gates are defaulted to the level switched into Vbot from HV switch bottom 16, and for either a program verify operation or an erase verify operation, the control gates of a particular sector are defaulted and biased to a common voltage. Note that for any of the read operations, only the select gates (e.g. SG0-SGN) of a particular selected set of memory cells is selected (and driven accordingly with an appropriate Vsg by a select gate driver, not shown).

Depending on the type of read function, voltage select logic 13 provides Vselbot to select the appropriate voltage for HV switch bottom 16 to provide as Vbot. For a read operation, 1.5V is selected as Vbot (which may be referred to as a read control gate voltage), but for an erase verify or program verify erase function, 1.2V is selected as Vbot (which may be referred to as an erase verification voltage), and for a program verify erase function, 2.7V is selected as Vbot (which may be referred to as a program verification voltage). Also, voltage select logic 13 provides Vseltop to select 5V for Vtop (which may be referred to as a read control gate pass voltage), provides Vsel1 to select 1.5V as the output of voltage supply switch 53, and provides Vsel2 to select 5V (which may be referred to as a read control gate pass voltage) as the output of voltage supply switch 57. The control gates are defaulted to Vbot for the read operations. Since the control gate of transistor 62 is 0V, transistor 62 is turned off irrespective of pdeca and pdecb. With the values applied to the first current electrode and control gates of transistor 58, transistors 58 is turned off and the second current electrode of transistor 56 is such that transistor 60 is turned on. Therefore, the voltage of Vbot is provided as Vcg by way of transistor 60, such that the control gates coupled to CGL0 are biased with 1.5V, 1.2V, or 2.7V, depending on the type of read function. Note that direction of current flow is represented by arrow 70.

In an alternate embodiment, for a program verify read operation, the 2.7V can be applied as Vtop rather than Vbot. In this example, a full decode is performed such that when both pdeca and pdecb are asserted, the second current electrode of transistor 56 is pulled to Vss and the 2.7V of Vtop is provided as Vcg by way of transistor 58.

Therefore, by now it has been appreciated how a control gate driver, such as control gate driver 18, is able to apply and output the appropriate voltages during various different memory operations without damaging the transistors of the driver. In this manner, the control gate drivers of CG0-CGN may be consolidated into common wells which may result in greater area efficiency. For example, within control gate driver 18, transistors 54 and 60 may share a same well, and transistor 58 may share a well with other p-type transistors, if present. Furthermore, note that the high voltage supply switches, such as switches 14 and 16, can be amortized over a large number of word lines while still retaining fine granularity in control gate selection.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different voltage values may be used for the various memory operations described herein. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

One embodiment relates to a circuit for driving a control gate of a split-gate nonvolatile memory cell. The circuit includes a switched current source having a first node coupled to a first switched voltage source; a first transistor of a first type having a first current electrode coupled to the switched current source and a control electrode coupled to a second switched voltage source; a second transistor of the first type having a first current electrode coupled to a second node of the switched current source, a second current electrode coupled to an address decoder circuit, and a control electrode coupled to a third switched voltage source; a third transistor of the first type having a control electrode coupled to a second current electrode of the second transistor of the first type, and a first current electrode coupled to a second current electrode of the first transistor of the first type and a fourth switched voltage source; and a first transistor of a second type having a first current electrode coupled to the first switched voltage source, a control electrode coupled to the second node of the switched current source, and a second current electrode coupled to a second current electrode of the third transistor of the first type at a driver voltage node, wherein a voltage level at the driver voltage node is operable to drive the control gate of the split-gate nonvolatile memory cell. In one aspect of the above embodiment, the first switched voltage source is operable to provide a erase control gate voltage, a program control gate voltage, and a read control gate pass voltage. In another aspect, the first switched voltage source is operable to provide a erase control gate voltage, a program verification voltage, a program control gate voltage, and a read control gate pass voltage. In another aspect, the second switched voltage source is operable to provide a supply voltage, an erase control gate voltage and a read control gate voltage. In another aspect, the third switched voltage source is operable to provide a read control gate pass voltage and an erase protection voltage. In another aspect, the fourth switched voltage source is operable to provide an erase verification voltage, a program verification voltage, a read control gate voltage, a read control gate pass voltage, and an erase protection voltage. In another aspect, the fourth switched voltage source is operable to provide an erase verification voltage, a read control gate voltage, a read control gate pass voltage, and an erase protection voltage. In another aspect, the switched current source includes a second transistor of the second type. In another aspect, the address decoder circuit includes components operable to receive a plurality of pre-decode signals. In another aspect, the circuit is operable to perform a program select operation on the split-gate nonvolatile memory cell such that the voltage level at the driver voltage node is appropriate for the program select operation, wherein a voltage supplied by the first switched voltage source is a program control gate voltage, a voltage supplied by the second switched voltage source is a read control gate voltage, a voltage supplied by the third switched voltage source is a read control gate pass voltage, and a voltage supplied by the fourth switched voltage source is a read control gate voltage. In another aspect, the circuit is operable to perform a program deselect operation on the split-gate nonvolatile memory cell such that the voltage level at the driver voltage node is appropriate for the program deselect operation, wherein a voltage supplied by the first switched voltage source is a program control gate voltage, a voltage supplied by the second switched voltage source is a read control gate voltage, a voltage supplied by the third switched voltage source is a read control gate pass voltage, and a voltage supplied by the fourth switched voltage source is a read control gate voltage. In another aspect, the circuit is operable to perform an erase operation on the split-gate nonvolatile memory cell such that the voltage level at the driver voltage node is appropriate for the erase operation, wherein a voltage supplied by the first switched voltage source is an erase control gate voltage, a voltage supplied by the second switched voltage source is the erase control gate voltage, a voltage supplied by the third switched voltage source is an erase protection voltage, and a voltage supplied by the fourth switched voltage source is the erase protection voltage. In another aspect, the circuit is operable to perform a read operation on the split-gate nonvolatile memory cell such that the voltage level at the driver voltage node is appropriate for the read operation, wherein a voltage supplied by the first switched voltage source is a read control gate pass voltage, a voltage supplied by the second switched voltage source is a read control gate voltage, a voltage supplied by the third switched voltage source is a read control gate pass voltage, and a voltage supplied by the fourth switched voltage source is a read control gate voltage. In another aspect, the circuit is operable to perform an erase verify operation on the split-gate nonvolatile memory cell such that the voltage level at the driver voltage node is appropriate for the erase verify operation, wherein a voltage supplied by the first switched voltage source is a read control gate pass voltage, a voltage supplied by the third switched voltage source is the read control gate pass voltage, and a voltage supplied by the fourth switched voltage source is an erase verification voltage. In another aspect, the circuit is operable to perform a program verify operation on the split-gate nonvolatile memory cell such that the voltage level at the driver voltage node is appropriate for the program verify operation, wherein a voltage supplied by the first switched voltage source is a read control gate pass voltage, a voltage supplied by the third switched voltage source is the read control gate pass voltage, and a voltage supplied by the fourth switched voltage source is a program verification voltage. In another aspect, the first, second, and third transistors of the first type share a well of the first type. In yet a further aspect, the first and second transistors of the second type share a well of the second type.

Another embodiment relates to a method for driving a control gate of a split-gate nonvolatile memory cell. The method includes selecting a first voltage for a first switched voltage source, the first voltage selected from a group consisting of an erase control gate voltage, a program control gate voltage, and a read control gate pass voltage; selecting a second voltage for a second switched voltage source, the second voltage selected from a group consisting of a source voltage, the erase control gate voltage, and a read control gate voltage; selecting a third voltage for a third switched voltage source, the third voltage selected from a group consisting of the read control gate pass voltage and an erase protection voltage; selecting a fourth voltage for a fourth switched voltage source, wherein the fourth voltage is selected from a group consisting of an erase verification voltage, the read control gate voltage, the read control gate pass voltage, the erase protection voltage, and a program verification voltage; providing the first voltage to a first node of a switched current source, a first current electrode of a first transistor of a first type; providing the third voltage to a control electrode of a first transistor of a second type; providing the second voltage to a control electrode of a second transistor of the second type; and providing the fourth voltage to a second current electrode of the second transistor of the second type and a current electrode of a third transistor of the second type, wherein a second current electrode of the third transistor of the second type is coupled to a second current electrode of the first transistor of the first type at a driver voltage node, and a voltage level at the driver voltage node is operable to drive the control gate of the split-gate nonvolatile memory cell in a plurality of operation modes selected from the group consisting of: a program selection process, a program deselection process, an erase process, a read process, an erase verification process, and a program verification process. In one aspect of the above embodiment, the method further includes decoding an address signal, the address signal communicating data associated with an address of the nonvolatile memory cell.

Yet another embodiment relates to a method for driving a control gate of a split-gate nonvolatile memory cell. The method includes selecting a first voltage for a first switched voltage source, the first voltage selected from a group consisting of an erase control gate voltage, a program control gate voltage, a read control gate pass voltage, and a program verification voltage; selecting a second voltage for a second switched voltage source, the second voltage selected from a group consisting of a source voltage, the erase control gate voltage, and a read control gate voltage; selecting a third voltage for a third switched voltage source, the third voltage selected from a group consisting of the read control gate pass voltage and an erase protection voltage; selecting a fourth voltage for a fourth switched voltage source, wherein the fourth voltage is selected from a group consisting of an erase verification voltage, the read control gate voltage, the read control gate pass voltage, and the erase protection voltage; providing the first voltage to a first node of a switched current source, a first current electrode of a first transistor of a first type, and a first current electrode of a first transistor of a second type; providing the second voltage to a control electrode of a second transistor of the second type; providing the third voltage to a control electrode of the first transistor of the second type; and providing the fourth voltage to a second current electrode of the second transistor of the second type and a current electrode of a third transistor of the second type, wherein a second current electrode of the third transistor of the second type is coupled to a second current electrode of the first transistor of the first type at a driver voltage node, and a voltage level at the driver voltage node is operable to drive the control gate of the split-gate nonvolatile memory cell in a plurality of operation modes selected from the group consisting of: a program selection process, a program deselection process, an erase process, a read process, an erase verification process, and a program verification process.

What is claimed is:

1. A circuit for driving a control gate of a split-gate nonvolatile memory cell, the circuit comprising:
    a switched current source having a first node coupled to a first switched voltage source;
    a first transistor of a first type having a first current electrode coupled to the switched current source and a control electrode coupled to a second switched voltage source;
    a second transistor of the first type having a first current electrode coupled to a second node of the switched current source, a second current electrode coupled to an address decoder circuit, and a control electrode coupled to a third switched voltage source;
    a third transistor of the first type having a control electrode coupled to a second current electrode of the second transistor of the first type, and a first current electrode coupled to a second current electrode of the first transistor of the first type and a fourth switched voltage source; and
    a first transistor of a second type having a first current electrode coupled to the first switched voltage source, a control electrode coupled to the second node of the switched current source, and a second current electrode coupled to a second current electrode of the third transistor of the first type at a driver voltage node, wherein a voltage level at the driver voltage node is operable to drive the control gate of the split-gate nonvolatile memory cell.

2. The circuit of claim 1, wherein the first switched voltage source is operable to provide a erase control gate voltage, a program control gate voltage, and a read control gate pass voltage.

3. The circuit of claim 1, wherein the first switched voltage source is operable to provide a erase control gate voltage, a program verification voltage, a program control gate voltage, and a read control gate pass voltage.

4. The circuit of claim 1, wherein the second switched voltage source is operable to provide a supply voltage, an erase control gate voltage and a read control gate voltage.

5. The circuit of claim 1, wherein the third switched voltage source is operable to provide a read control gate pass voltage and an erase protection voltage.

6. The circuit of claim 1, wherein the fourth switched voltage source is operable to provide an erase verification voltage, a program verification voltage, a read control gate voltage, a read control gate pass voltage, and an erase protection voltage.

7. The circuit of claim 1, wherein the fourth switched voltage source is operable to provide an erase verification voltage, a read control gate voltage, a read control gate pass voltage, and an erase protection voltage.

8. The circuit of claim 1, wherein the switched current source comprises a second transistor of the second type.

9. The circuit of claim 1, wherein the address decoder circuit comprises components operable to receive a plurality of pre-decode signals.

10. The circuit of claim 1, wherein the circuit is operable to perform a program select operation on the split-gate nonvolatile memory cell such that the voltage level at the driver voltage node is appropriate for the program select operation, wherein:
- a voltage supplied by the first switched voltage source is a program control gate voltage;
- a voltage supplied by the second switched voltage source is a read control gate voltage;
- a voltage supplied by the third switched voltage source is a read control gate pass voltage; and
- a voltage supplied by the fourth switched voltage source is a read control gate voltage.

11. The circuit of claim 1, wherein the circuit is operable to perform an erase operation on the split-gate nonvolatile memory cell such that the voltage level at the driver voltage node is appropriate for the erase operation, wherein:
- a voltage supplied by the first switched voltage source is an erase control gate voltage;
- a voltage supplied by the second switched voltage source is the erase control gate voltage;
- a voltage supplied by the third switched voltage source is an erase protection voltage; and
- a voltage supplied by the fourth switched voltage source is the erase protection voltage.

12. The circuit of claim 1, wherein the circuit is operable to perform a read operation on the split-gate nonvolatile memory cell such that the voltage level at the driver voltage node is appropriate for the read operation, wherein:
- a voltage supplied by the first switched voltage source is a read control gate pass voltage;
- a voltage supplied by the second switched voltage source is a read control gate voltage;
- a voltage supplied by the third switched voltage source is a read control gate pass voltage; and
- a voltage supplied by the fourth switched voltage source is a read control gate voltage.

13. The circuit of claim 1, wherein the circuit is operable to perform an erase verify operation on the split-gate nonvolatile memory cell such that the voltage level at the driver voltage node is appropriate for the erase verify operation, wherein:
- a voltage supplied by the first switched voltage source is a read control gate pass voltage;
- a voltage supplied by the third switched voltage source is the read control gate pass voltage; and
- a voltage supplied by the fourth switched voltage source is an erase verification voltage.

14. The circuit of claim 1, wherein the circuit is operable to perform a program verify operation on the split-gate nonvolatile memory cell such that the voltage level at the driver voltage node is appropriate for the program verify operation, wherein:
- a voltage supplied by the first switched voltage source is a read control gate pass voltage;
- a voltage supplied by the third switched voltage source is the read control gate pass voltage; and
- a voltage supplied by the fourth switched voltage source is a program verification voltage.

15. The circuit of claim 1, wherein the first, second, and third transistors of the first type share a well of the first type.

16. The circuit of claim 8, wherein the first and second transistors of the second type share a well of the second type.

17. A method for driving a control gate of a split-gate nonvolatile memory cell, the method comprising:
- selecting a first voltage for a first switched voltage source, the first voltage selected from a group consisting of an erase control gate voltage, a program control gate voltage, and a read control gate pass voltage;
- selecting a second voltage for a second switched voltage source, the second voltage selected from a group consisting of a source voltage, the erase control gate voltage, and a read control gate voltage;
- selecting a third voltage for a third switched voltage source, the third voltage selected from a group consisting of the read control gate pass voltage and an erase protection voltage;
- selecting a fourth voltage for a fourth switched voltage source, wherein the fourth voltage is selected from a group consisting of an erase verification voltage, the read control gate voltage, the read control gate pass voltage, the erase protection voltage, and a program verification voltage;
- providing the first voltage to a first node of a switched current source, a first current electrode of a first transistor of a first type;
- providing the third voltage to a control electrode of a first transistor of a second type;
- providing the second voltage to a control electrode of a second transistor of the second type; and
- providing the fourth voltage to a second current electrode of the second transistor of the second type and a current electrode of a third transistor of the second type, wherein:
- a second current electrode of the third transistor of the second type is coupled to a second current electrode of the first transistor of the first type at a driver voltage node; and
- a voltage level at the driver voltage node is operable to drive the control gate of the split-gate nonvolatile memory cell in a plurality of operation modes selected from the group consisting of: a program selection process, a program deselection process, an erase process, a read process, an erase verification process, and a program verification process.

18. The method of claim 17, further comprising decoding an address signal, the address signal communicating data associated with an address of the nonvolatile memory cell.

19. A method for driving a control gate of a split-gate nonvolatile memory cell, the method comprising:
- selecting a first voltage for a first switched voltage source, the first voltage selected from a group consisting of an erase control gate voltage, a program control gate voltage, a read control gate pass voltage, and a program verification voltage;

selecting a second voltage for a second switched voltage source, the second voltage selected from a group consisting of a source voltage, the erase control gate voltage, and a read control gate voltage;

selecting a third voltage for a third switched voltage source, the third voltage selected from a group consisting of the read control gate pass voltage and an erase protection voltage;

selecting a fourth voltage for a fourth switched voltage source, wherein the fourth voltage is selected from a group consisting of an erase verification voltage, the read control gate voltage, the read control gate pass voltage, and the erase protection voltage;

providing the first voltage to a first node of a switched current source, a first current electrode of a first transistor of a first type, and a first current electrode of a first transistor of a second type;

providing the second voltage to a control electrode of a second transistor of the second type;

providing the third voltage to a control electrode of the first transistor of the second type; and providing the fourth voltage to a second current electrode of the second transistor of the second type and a current electrode of a third transistor of the second type, wherein:

a second current electrode of the third transistor of the second type is coupled to a second current electrode of the first transistor of the first type at a driver voltage node; and a voltage level at the driver voltage node is operable to drive the control gate of the split-gate nonvolatile memory cell in a plurality of operation modes selected from the group consisting of: a program selection process, a program deselection process, an erase process, a read process, an erase verification process, and a program verification process.

* * * * *